(12) United States Patent
Chen et al.

(10) Patent No.: US 8,273,616 B2
(45) Date of Patent: Sep. 25, 2012

(54) GATED-VARACTORS

(75) Inventors: Chia-Chung Chen, Keelung (TW);
Chewn-Pu Jou, Hsinchu (TW);
Chin-Wei Kuo, Hsinchu (TW); Sally Liu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 335 days.

(21) Appl. No.: 12/708,603

(22) Filed: Feb. 19, 2010

(65) Prior Publication Data

US 2011/0204969 A1 Aug. 25, 2011

(51) Int. Cl.
*H01L 21/00* (2006.01)

(52) U.S. Cl. ........ 438/184; 438/199; 438/379; 438/392; 257/E21.632; 257/E29.345

(58) Field of Classification Search .......... 438/184–199, 438/379, 382; 257/303, 312, 315, 344, 345, 257/348, 351, 369, 595, E21.632, 29.155, 257/292

See application file for complete search history.

(56) References Cited

U.S. PATENT DOCUMENTS

| | | | | |
|---|---|---|---|---|
| 5,514,904 | A * | 5/1996 | Onga et al. | 257/627 |
| 6,528,842 | B1 * | 3/2003 | Luich et al. | 257/315 |
| 6,653,716 | B1 * | 11/2003 | Vashchenko et al. | 257/596 |
| 6,674,116 | B1 * | 1/2004 | Cao | 257/312 |
| 6,778,022 | B1 * | 8/2004 | Zhang et al. | 331/14 |
| 6,825,546 | B1 * | 11/2004 | Walker et al. | 257/596 |
| 7,053,465 | B2 * | 5/2006 | Benaissa et al. | 257/595 |
| 7,094,694 | B2 * | 8/2006 | Cheong et al. | 438/682 |
| 7,211,875 | B2 * | 5/2007 | Kurosawa et al. | 257/532 |
| 7,223,667 | B2 * | 5/2007 | Tseng | 438/379 |
| 7,235,862 | B2 * | 6/2007 | Bulucea | 257/595 |
| 7,579,642 | B1 * | 8/2009 | Bulucea | 257/303 |
| 7,990,210 | B2 * | 8/2011 | Iida et al. | 330/4.9 |
| 2006/0125012 | A1 * | 6/2006 | Fathimulla | 257/351 |
| 2009/0057742 | A1 * | 3/2009 | Lee et al. | 257/312 |
| 2012/0043590 | A1 * | 2/2012 | Chen et al. | 257/288 |

FOREIGN PATENT DOCUMENTS

TW 247362 1/2006

OTHER PUBLICATIONS

Wong, Wallace, et al., "Wide Tuning Range Inversion-Mode Gated Varactor and Its Application on a 2-Ghz VCO", 1999 Symposium on VLSI Circuits Digest of Technical Papers, IEEE 2009, pp. 53-54.
Ho, Wen Tsern, et al., "Fully-Differential 13 Gbps Clock Recovery Circuit for OC-255 SONET Applications", Department of Electrical & Computer Engineering, McGill University, Canada, IEEE 2005, pp. 4879-4882.
Moon, Hyunwon, et al., "A Fully Differential LC-VCO Using a New Varactor Control Structure", IEEE Microwave and Wireless Components Letters, vol. 14, No. 9, Sep. 2004, pp. 410-412.

* cited by examiner

*Primary Examiner* — Michael Lebentritt
(74) *Attorney, Agent, or Firm* — Lowe Hauptman Ham & Berner, LLP

(57) ABSTRACT

Various embodiments of the invention provide a varactor structure that, depends on configurations, can provide a C-V characteristic based on one or a combination of a reverse bias junction capacitor, a channel capacitor, and an oxide capacitor. The junction capacitor is formed by reverse biasing the P+ source region and the N-well. The channel capacitance is formed between the P+ source region and the N+ drain region, and the oxide capacitor is formed in the gate oxide area. Depending on biasing one or a combination of the gate voltage VG, the source voltage VS, and the drain voltage VD, embodiments can utilize one or a combination of the above capacitors. Other embodiments using the varactors in a Voltage-Controlled Oscillator (VCO) are also disclosed.

20 Claims, 13 Drawing Sheets

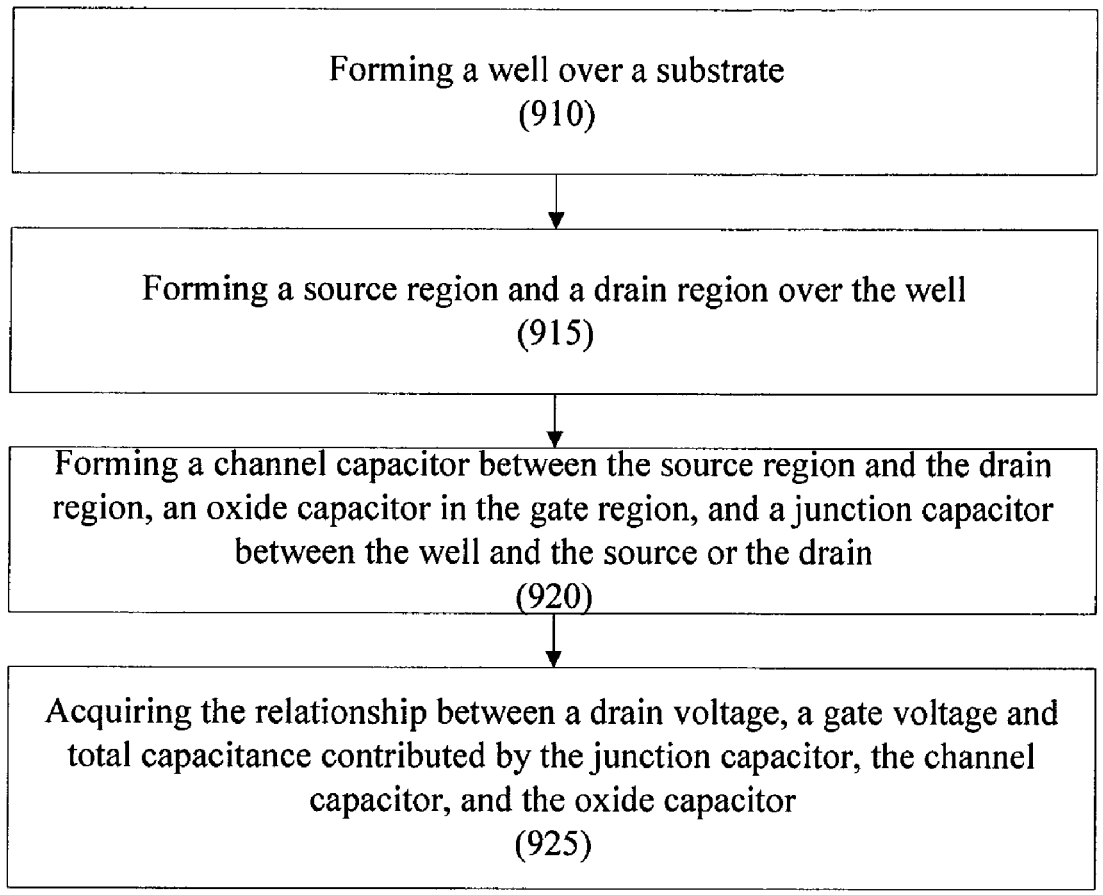
Fig. 9          900

GATED-VARACTORS

FIELD

The disclosure is generally related to varactors. In some embodiments, a four-terminal gated differential varactor is embedded in a full differential Inductor/Capacitor Voltage-Controlled Oscillator (LC VCO) for a System on Chip (SoC) application.

BACKGROUND

Varactors are a type of diodes having variable capacitance being a function of the voltage across it. Generally, traditional varactors have low tuning range, low Q-factor, high substrate coupling, and larger size. The high substrate coupling can cause common-mode phase noise. When using in microelectromechanical structure (MEMs) and/or Bi-Complementary Metal Oxide Silicon (BiCMOS) process, these varactors are not compatible with the CMOS process, which is widely used nowadays in many applications. As an example, in an approach, a single-ended semiconductor device having a gate node connected to a dual source terminal and to a P+ region, and a drain terminal connected to an N region, which forms a PN junction diode Capacitor-Voltage C-V) characteristic. In this configuration, the device, however, cannot benefit from the oxide capacitance due to the dominated junction capacitance of the forward PN junction. Further, this device requires a large die area, can use only the junction voltage to tune the capacitance variation, and results in a low tuning range and less efficiency on the varactor characteristics. In another example, an NMOS Varactor (NMOSVAR) can only benefit from the oxide capacitance and the channel capacitance, which limits the C-V range. In another example, a gated-diode using the forward PN junction with heavy doped areas in the N-well also limits the C-V characteristics.

BRIEF DESCRIPTION OF THE DRAWINGS

The details of one or more embodiments of the invention are set forth in the accompanying drawings and the description below. Other features and advantages of the disclosed embodiments will be apparent from the description, drawings, and claims.

FIG. 9 is a flowchart illustrating a method related to a varactor, in accordance with an embodiment.

Like reference symbols in the various drawings indicate like elements.

DETAILED DESCRIPTION

Figure 1A:
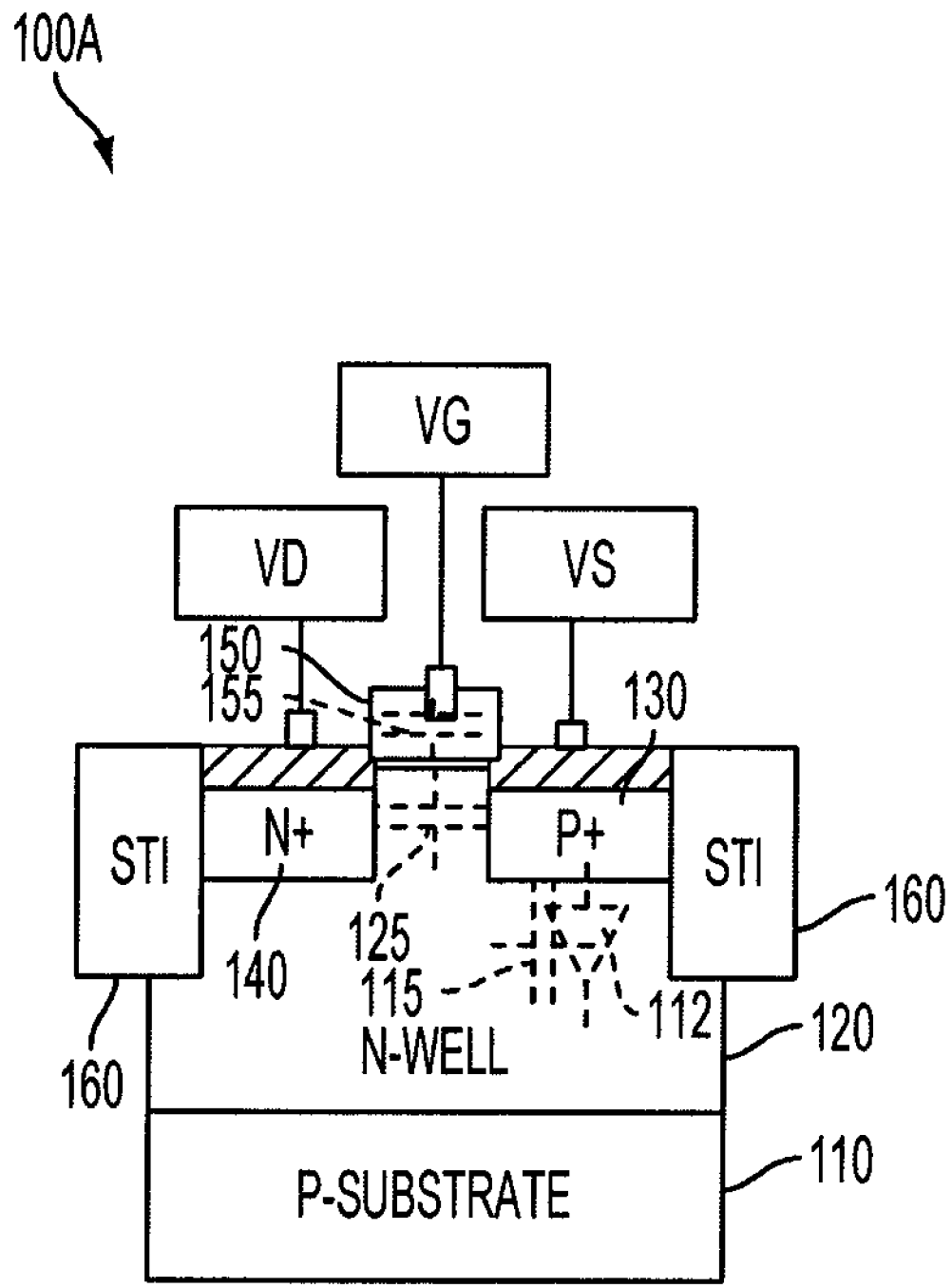
FIG. 1A shows an exemplary gated-varactor structure upon which embodiments of the invention may be implemented.

Embodiments, or examples, of the disclosure illustrated in the drawings are now being described using specific language. It will nevertheless be understood that no limitation of the scope of the invention is thereby intended. Any alterations and modifications in the described embodiments, and any further applications of principles of the disclosure described in this document are contemplated as would normally occur to one skilled in the art to which the invention relates. Reference numbers may be repeated throughout the embodiments, but this does not necessarily require that feature(s) of one embodiment apply to another embodiment, even if they share the same reference number.

Gated Varactor Structure

FIG. 1A shows a varactor structure 100A upon which embodiments of the invention may be implemented. Structure 100A may be referred to as a gated Metal-Oxide-Silicon Varactor (MOSVAR), or a Junction Varactor (JVAR, FIG. 1B) when the junction capacitor 115 is dominant. The term gated refers a structure similar to that of a gated diode and a MOS-like gate switch to tune the MOSVAR or the JVAR C-V characteristic. Voltages VS, VD, and VG are the voltage at the source, the drain and the gate of structure 100A respectively.

P-substrate 110, N-well 120, source region 130, drain region 140, gate region 150, and shallow trench isolations (STIs) 160 are commonly known in the art. Source region 130 is doped with P+ implant, and drain region 140 is doped with N+ implant. Using the P+ implant in source region 130 enables some embodiments of the invention to provide a reverse bias junction between P+ source region 130 and N-well 120, e.g., when voltages VG and VS are coupled together that provides a negative voltage across diode 112. Gate region 150 includes oxide capacitor 155. The above implant P+ for source region 130 and N+ for drain region 140 are for illustration. Embodiments of the invention are not limited to such a configuration, but are applicable to variations, including for example, a drain region P+, a source region N+ with corresponding P-well, N-well quad-ring for N+ on P-substrate, etc.

Diode 112 is formed between P+ source region 130 and N-well 120. Capacitor 115 corresponds to diode 112, and may be referred to as a junction capacitor because it is formed across the junction of the P+ source region 130 and the N-well 120. In various embodiments, capacitor 115 is formed by a reverse bias between P+ source region 130 and N-well 120, e.g., by coupling voltages VG and VS together. In this situation the voltage drop across diode 112 is negative; N-well 120 is lightly doped while P+ source region 130 is heavily doped, and, as a result, the PN junction can extend its capacitive variation from P+ source region 130 into N-well 120 using the lightly doped area of N-well 120. Consequently, junction capacitor 115 provides a wider range of C-V tuning characteristic, which is advantageous over other approaches having the forward bias with the heavily doped N-well area, resulting in a low tuning range. Forming the reverse junction for diode 112, embodiments of the invention can also take advantage of oxide capacitance 155, e.g., when the reverse-biased junction capacitor 115 is not capacitively dominant. In contrast, the forward junction in other approaches generally can only benefit from the junction capacitance without the benefit of the oxide capacitance because the junction capacitance is dominant over the oxide capacitance.

Capacitor 125 may be referred to as a channel capacitor. Depending on configurations channel, capacitor 125 may be considered as in series with oxide capacitor 155 and/or merged with junction capacitor 115. For example, when the gate terminal VG is not connected to the source terminal VS, channel capacitor 125 is in series with oxide capacitor 155 until there is an affect of voltage VD, but when the gate terminal VG is connected to the source terminal VS, channel capacitor 125 is merged into junction capacitor 115. Channel capacitor 125, based on the P+ source region 130 and the N+ drain region 140, comprises an inverse oxide channel capacitor and a P+/N− well junction depletion capacitor, as compared to other approaches that use the N+ implant for both the source and the drain regions that benefit only from the inverse oxide channel capacitor.

Oxide capacitor 155 is formed in oxide region 150. In various embodiments of the invention, oxide capacitance 155 provides the higher end (the maximum value) of the capacitance range in the C-V characteristics while junction capacitor 115 provides the lower end (minimum value) of the range, and channel capacitance 125, depending on configuration (e.g., in series or in shunt with other capacitor), provides appropriate capacitive effects.

Depending on applications, some embodiments of the invention use one or a combination of junction capacitor 115, channel capacitor 125, and oxide capacitor 155. Depending on configurations including voltage biases, each of junction capacitor 115, channel capacitor 125, and oxide capacitor 155 may contribute to the total capacitance variation or the C-V characteristic as in series or as a shunt. For example, channel capacitor 125 is in series with oxide capacitor 155 because oxide capacitor 155 is continually constant, e.g., when VG is equal to VDD. Channel capacitor 125 and junction capacitor 115, however, are in shunt, because they change based on biasing difference of gate voltage VG. Further, embodiments of the invention vary one or a combination of voltage VD and voltage VG to tune the total capacitance taking contributions of junction capacitor 115, channel capacitor 125, and oxide capacitor 155.

In various embodiments of the invention, the C-V characteristic of structure 100A uses the variation of oxide capacitance 155 and junction capacitance 115, which is more advantageous than the forward bias junction capacitance that uses only the junction capacitance variation. Further, the resistance under the gate-oxide area is lower than the resistance in the area under STI region 160 because of the lower resistance in N-well 120, which improves performance of MOSVAR 100A as MOSVAR 100A and JVAR 100B provide higher Q and higher tuning ratio.

Figure 1B:
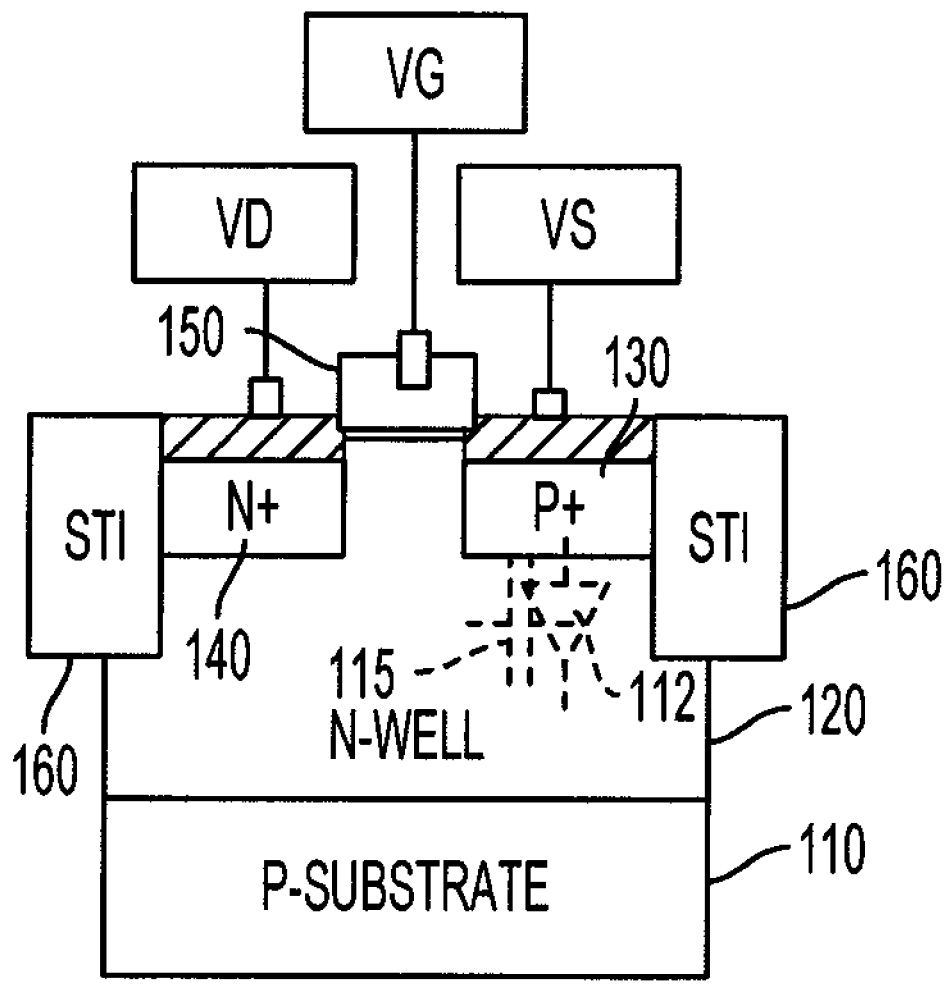
FIG. 1B shows a gated-JVAR based on a configuration of the varactor structure in FIG. 1A, in accordance with an embodiment.

FIG. 1B shows a structure 100B representing junction capacitor 115 in dominance based on a configuration of structure 100A, in accordance with an embodiment. Structure 100B is similar to structure 100A, but terminals VG and VS are coupled together to form a capacitor. Because of the dominance of the junction capacitor 115, structure 100B may be referred to as a Junction Varactor (JVAR) structure. When terminals VG and VS are coupled together, gate voltage VG and source voltage VS are the same causing the shunt of junction capacitor 115, oxide capacitor 155 and channel capacitor 125. Alternatively expressing, oxide capacitor 155 are in series with channel capacitor 125, and both of them are merged into junction capacitance 115, or junction capacitor 115 dominates the main contribution to the total capacitance of the C-V characteristic.

Illustrative Waveforms

Figure 2:
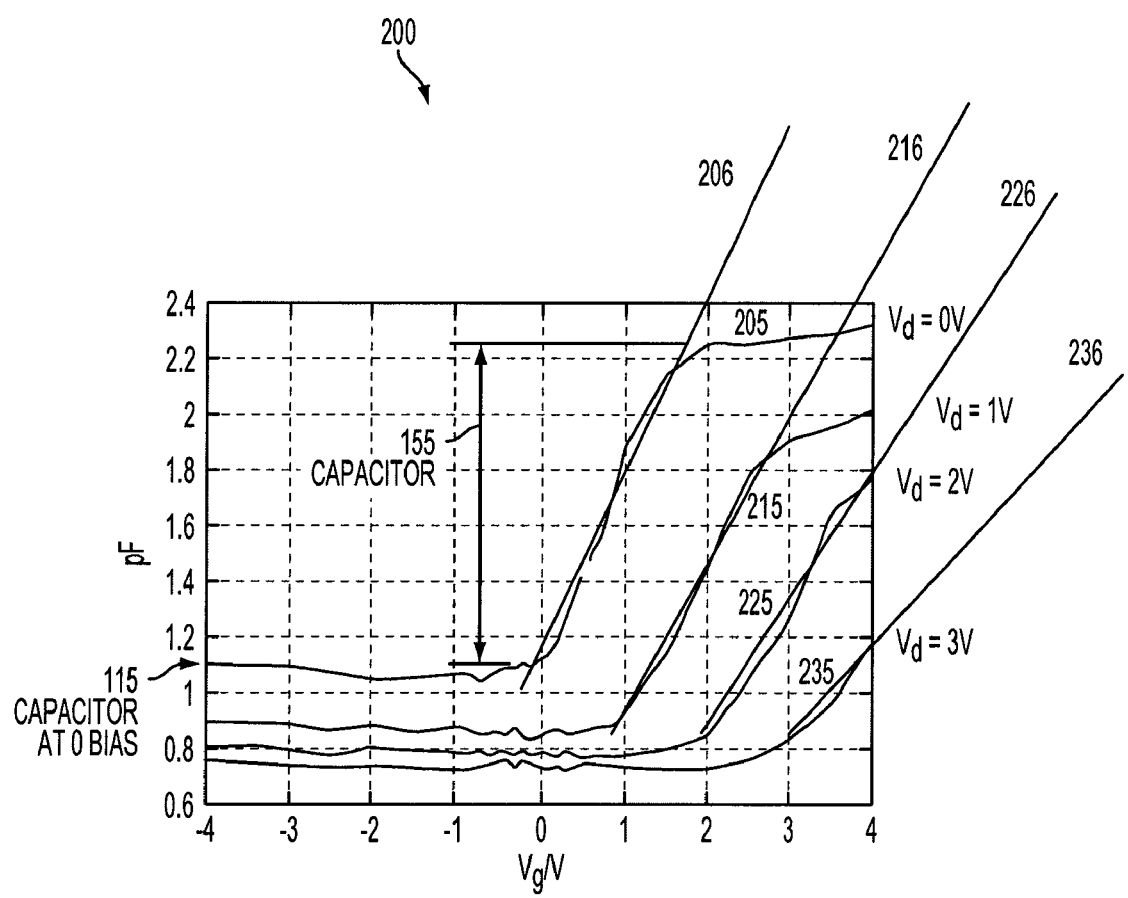
FIG. 2 shows the C-V relationship illustrating performance of the varactor structure in FIG. 1A, in accordance with an embodiment.

FIG. 2 shows waveforms 200 illustrating the C-V characteristic of gated MOSVAR 100A or the relationship between the total capacitance (e.g., capacitance of junction capacitor 115, channel capacitor 125, and oxide capacitor 155) and gate voltage VG of gated MOSVAR 100A, at various values of drain voltage VD, in accordance with an embodiment. The vertical axis represents MOSVAR capacitance in pico-Farads (pF) measured between terminals VG and VD of MOSVAR 100A while the horizontal axis represents voltage VG in Volts (V). In the illustration of FIG. 2, junction capacitor 115 is biased at 0V (i.e., VS=0V) and the frequency is at 2.0 GHz. Waveforms 205, 215, 225, and 235 represent the C-V characteristic at VD=0V, 1V, 2V, and 3V respectively. Waveforms 205, 215, 225, and 235 show that initially the total capacitance is at the value of junction capacitor 115 at zero bias (e.g., capacitance 115-0), and eventually is settled at the value of oxide capacitor 155. Channel capacitance 125 contributes to capacitance 115-0 as capacitance 125 (and oxide capacitance 155) is merged into capacitance 115-0. Those skilled in the art will recognize that waveform 205 represents the C-V characteristic without the effect of voltage VD because voltage VD is at 0V.

Lines 206, 216, 226, and 236 represent the slopes of waveforms 205, 215, 225, and 235, respectively. As illustrated, the slopes of these C-V characteristics vary at different values of voltage VD (e.g., VD=0V, VD=1V, VD=2V, and VD=3V). In various embodiments of the invention, to achieve a desired slope, embodiments, using the waveform characteristics, can easily adjust voltage VD, which is advantageous over other approaches where this slope depends on both voltage VD and voltage Vth, the threshold voltage of the underlying transistor. Further, in those approaches, tuning the total capacitance of the oxide capacitance and the junction capacitance also depends on the size of the underlying transistor, which is not easily obtainable.

When VG equal 0V (or VS), the performance of MOSVAR 100A is essentially the performance of JVAR 100B, because when VG=0, capacitance 115-0 dominates, e.g., being the total capacitor.

Figure 3:
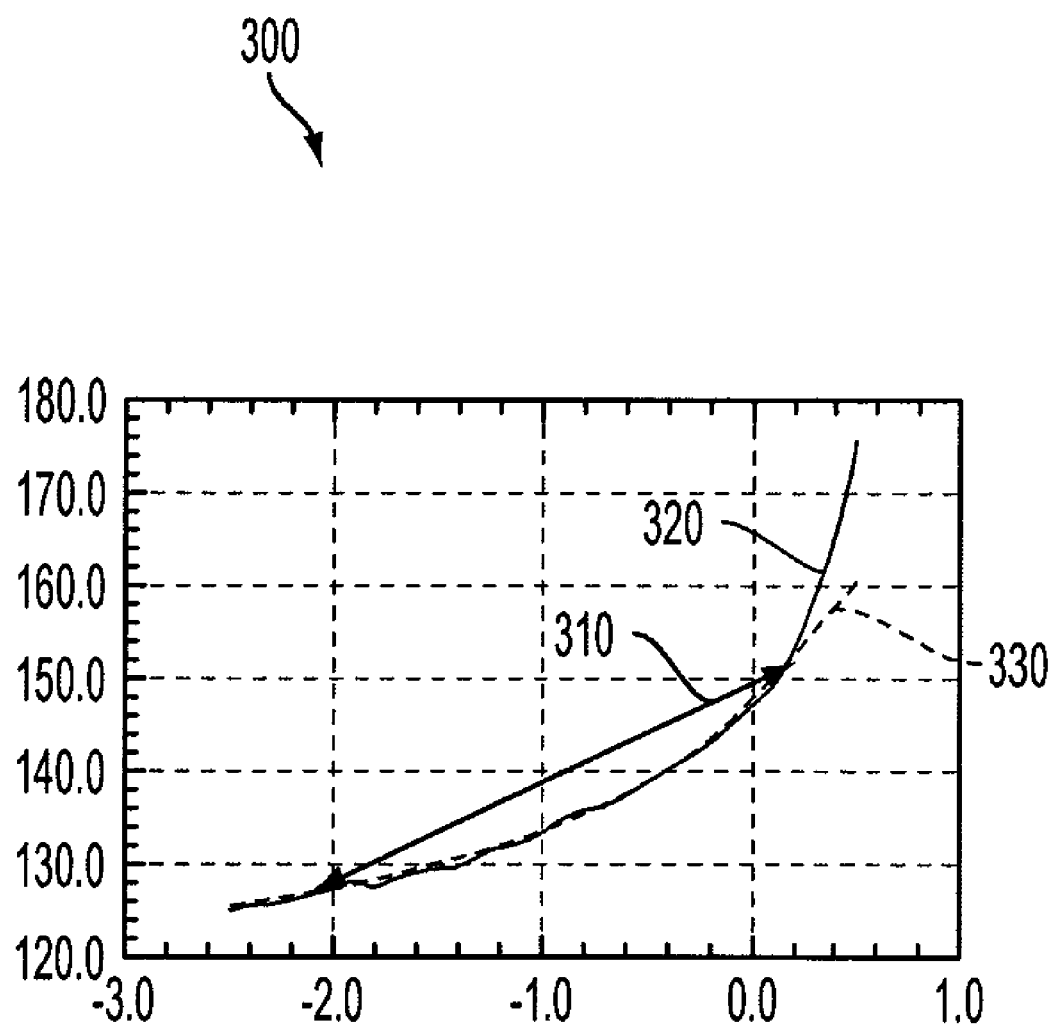
FIG. 3 shows the C-V relationship illustrating characteristic of the J-VAR in FIG. 1B, in accordance with an embodiment.

FIG. 3 shows waveforms 300 illustrating the C-V characteristic of junction capacitor 115, in accordance with an embodiment. The vertical axis represents capacitance in pF while the horizontal axis represents voltage VG in V. Waveform 320 represents the measured data while waveform 330 represents the simulated data, which mostly overlap one another. As shown in FIG. 3, the slope of the C-V characteristics represented by line 310 is negative because diode 112 or junction P+/Nwell is reversed biased in accordance with various embodiments of the invention, as compared to a positive slope of other approaches where the comparable junction is forward biased.

Four-Terminal Differential Gated Varactor Embodiments

Figure 4A:
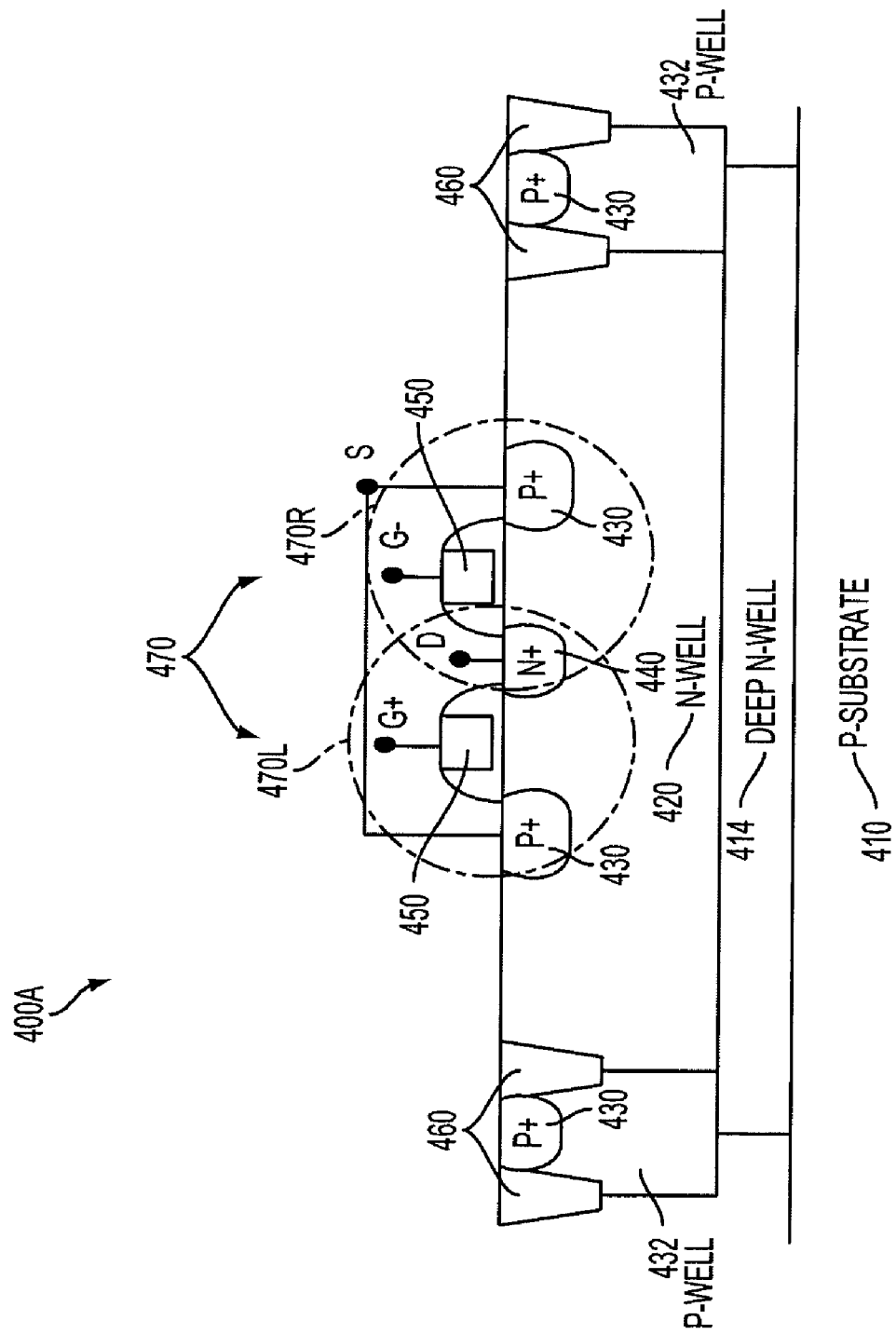
FIG. 4A shows a four terminal differential varactor utilizing the varactor structure in FIG. 1A, in accordance with an embodiment.

FIG. 4A shows a structure 400A illustrating a four-terminal differential gated varactor in accordance with an embodiment.

P-substrate 410, N-well 420, source regions 430, drain regions 440, gate regions 440, and STIs 460 are commonly known in the art, and are comparable to P-substrate 110, N-well 120, source region 130, drain region 140, gate regions 150, and STIs 160 in FIG. 1. Deep N-well 414 and P-well 432 are also commonly known in the art. Deep N-well 414 can provide more RF performance and P-well 432 is used around P+ area to form a guard-ring that can protect device performance against effects of nearby devices. Depending on applications, embodiments of the invention, however, may be used without a deep N-well.

Differential varactor 470 includes a pair of two varactors 470L and 470R that may be formed based on varactor structure 100A. In some embodiments, one varactor being placed next to each other, but these two varactors 470L and 470R, however, share the same drain region 440 with a drain terminal D. Source regions 430 of varactors 470L and 470R are coupled together to form a source terminal S and enable the same voltage bias. Further, one gate (e.g., the gate of varactor 4D70L) is used for a positive voltage (e.g., terminal G+), and the other gate (e.g., the gate of varactor 470R) is used for a negative voltage (e.g., terminal G−). In effect, differential varactor 470 includes a pair of junction capacitors, between the pair of source regions 430 and N-well 420, a pair of channel capacitors between drain region 440 and the pair of source regions 420, and a pair of oxide capacitors in the pair of gate regions 450. Those skilled in the art will recognize that embodiments of the invention are not limited to the configuration in FIG. 4A. Any gate region 450 may be used as a negative or positive terminal. Varactor 470 may be referred to as a differential gated-MOSVAR, a differential varactor pair, etc., but depending on applications, a varactor 470L or 470R may function as a single-ended gated MOS VAR.

Depending on applications, to have P-substrate 410 function as an insulator with high resistance, rather than a semiconductor, various embodiments of the invention use oxide proton as the buried oxidation in substrate 410 so that the higher resistance can better isolate substrate 410 from AC signals from other sections/circuitry. Alternatively expressing, the buried oxidation can prevent AC coupling into the substrate 410.

Figure 4B:
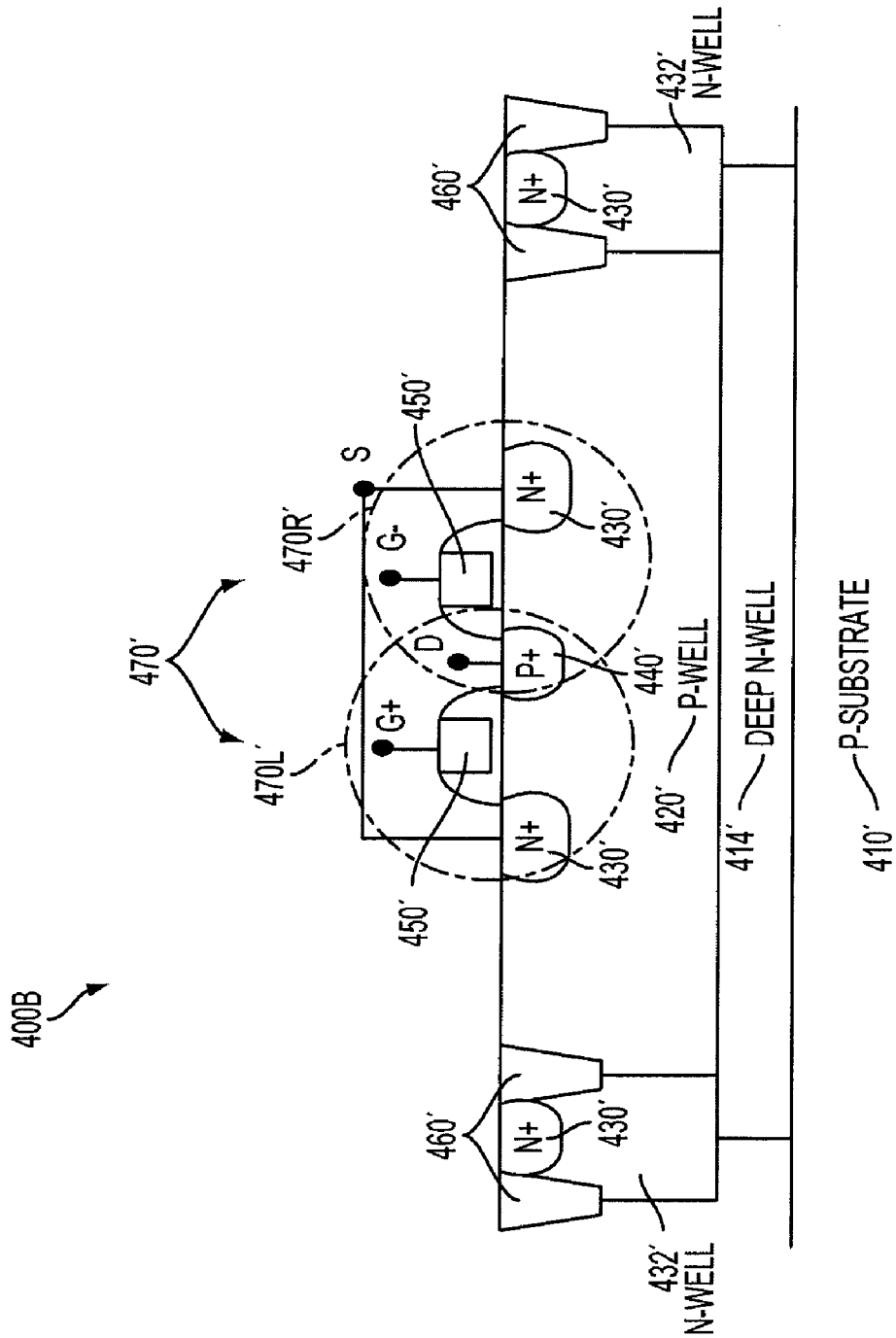
FIG. 4B shows a four terminal differential varactor, in accordance with another embodiment.

FIG. 4B shows a structure 400B illustrating a four-terminal differential gated varactor in accordance with a second embodiment. As compared to structure 400A, structure 400B includes various layers having dopants reversed to those of structure 400A. For example, N-well 420, P-well 432, P+ source region 430, and N+ drain region 440 have been replaced by P-well 420', N-well 432', N+ source region 430', and P+ drain region 440'. Some layers are unchanged (e.g., P-substrate, deep N-well, STI, gate region, etc.) because they can function in both structures 400A and 400B. For example, a deep N-well (e.g., N-well 410 or 410') can function with both an N-well (e.g., N-well 420) and a P-well (e.g., P-well 420'), and the STI and gate region are independent of the dopant types, etc.

Figure 4C:
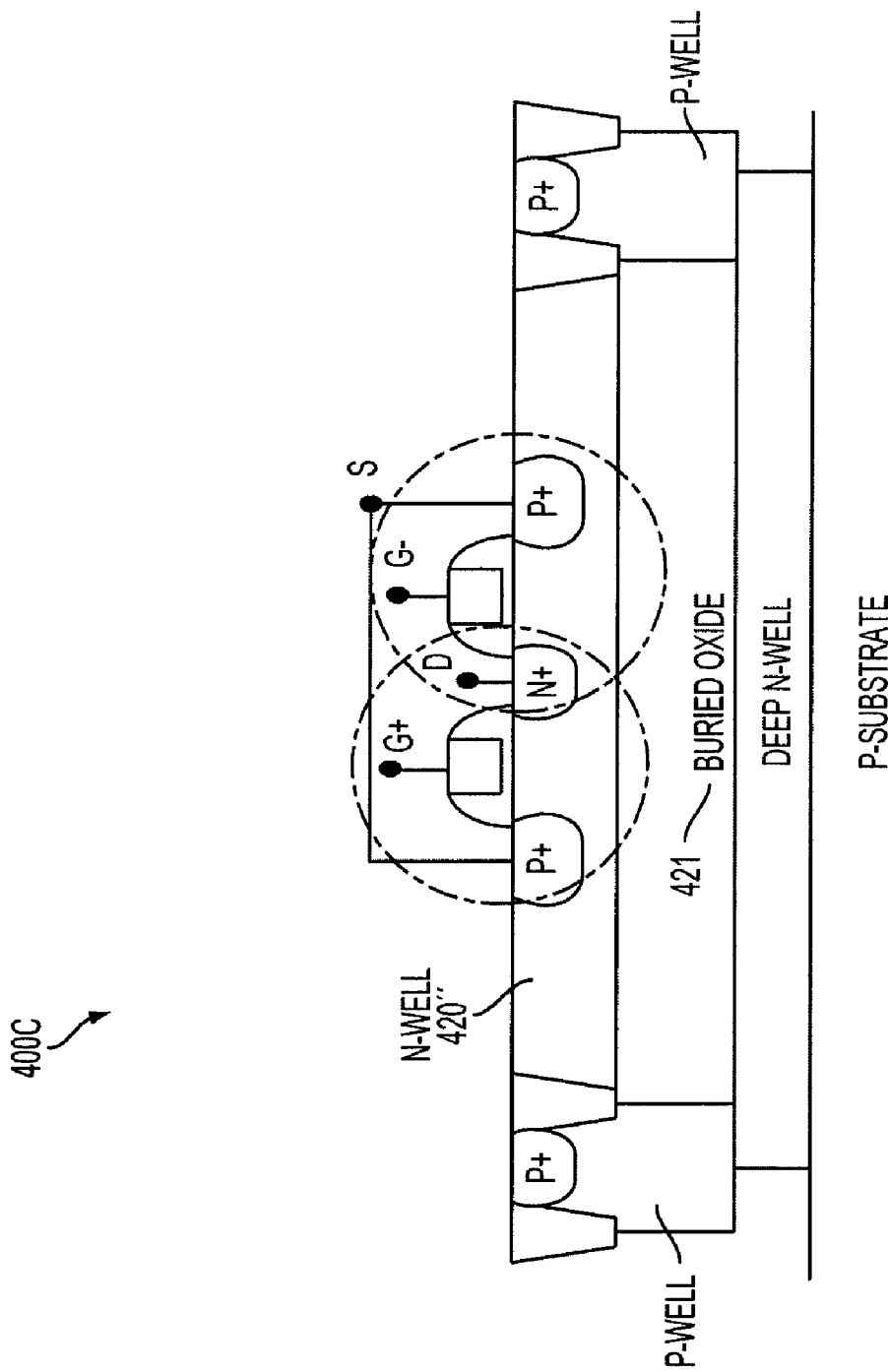
FIG. 4C shows a four terminal differential varactor, in accordance with yet another embodiment.

FIG. 4C shows a structure 400C illustrating a four-terminal differential gated varactor in accordance with a third embodiment using an SOI (Silicon on Insulator) process. As compared to structure 400A, the N-well area 420 has been replaced by an N-well (e.g., N-well 420") and a buried oxide layer 421. For simplicity other reference numbers are not shown in FIG. 4C. Buried oxide layer 421 is formed to prevent effects from the substrate (e.g., substrate 410). The two junction diodes are formed between the source regions 430 and buried oxide 421. Channel capacitance between source regions 430 and drain region 440 and oxide capacitance in the gate oxide are formed similar to those in FIG. 4A. Varactor 400B in FIG. 4B may also be built using the SOI process similar to varactor 400A being built using SOI process shown in FIG. 4C.

Figure 4D:
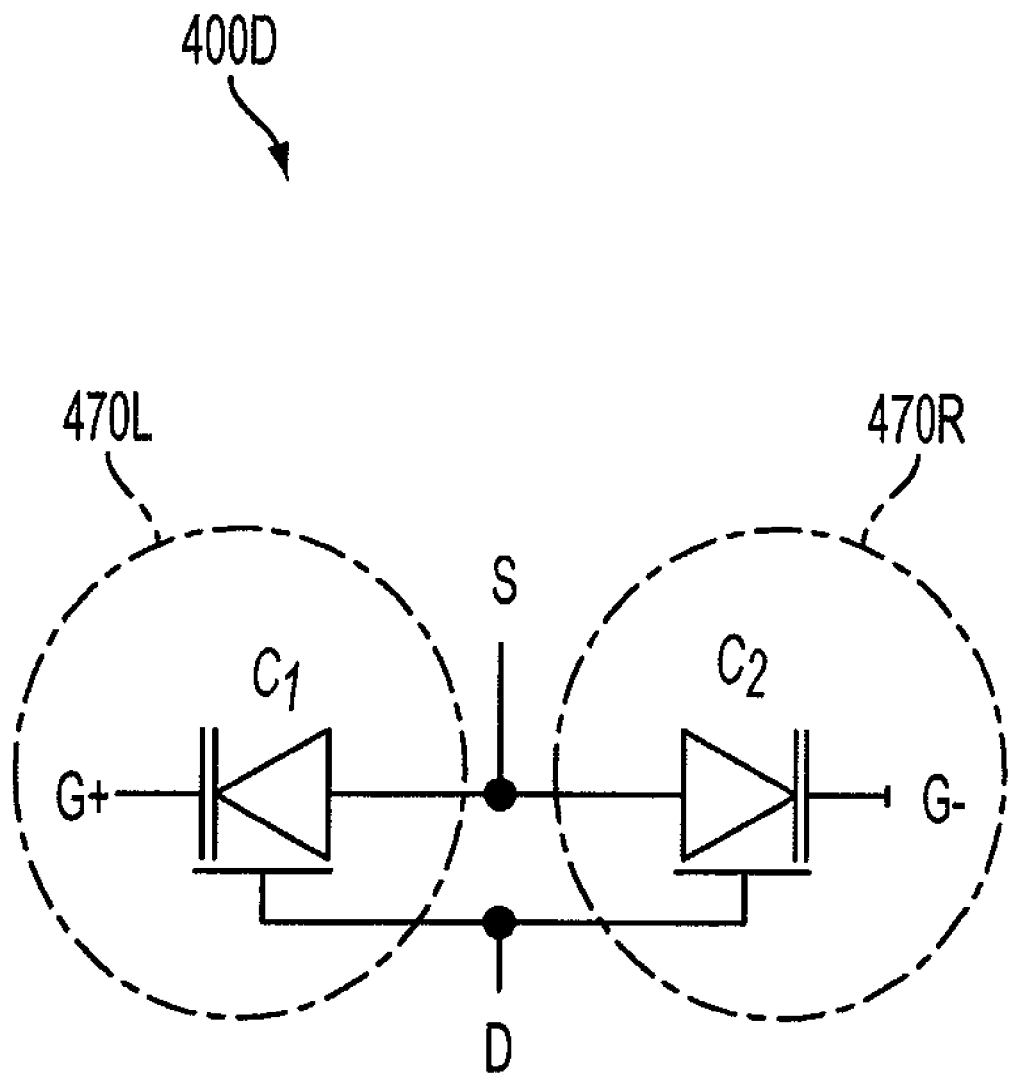
FIG. 4D shows a circuit representation of the differential varactor in FIG. 4A, in accordance with an embodiment.

FIG. 4D shows a circuit 400D representing varactor 470 of FIG. 4A, in accordance with an embodiment (or varactors as depicted in FIGS. 4B and 4C). Varactors 470L and 470R are symbolized by varactor capacitors C1 and C2 respectively, having the same positive terminal G+, negative terminal G−, source terminal S, and drain terminal D. In some embodiments, the four terminals G+, G−, S, and D, varactor 400D (or 470) may be referred to as a four-terminal varactor. In various embodiment of the invention, varactor 400D can provide a C-V characteristic based on varying one or a combination of voltages at terminals G+, G−, D, and S.

Figure 5:
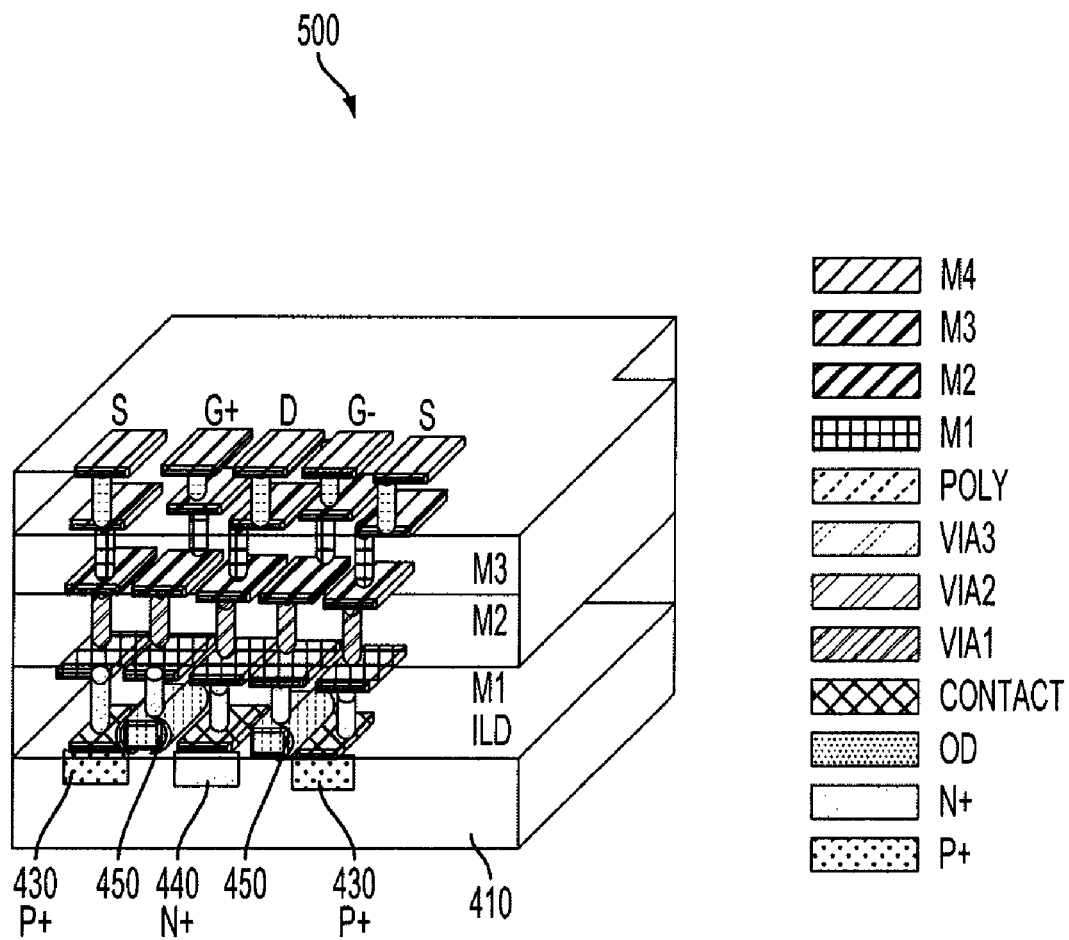
FIG. 5 shows a three-dimensional structure of the differential varactor of FIG. 4A. yes

FIG. 5 shows a three-dimensional structure 500 illustrating varactor 470 being built as a finger-type symmetrical differential varactor. In this illustrative structure 500, the process could be standard CMOS process having a substrate 410 with Si-bulk or SOI CMOS process substrate. Generally, the substrate of the standard CMOS process is less ohmic than that of the SOI CMOS process. The four terminals G, G+, D, and S of varactor 470 are connected through the vias to the gate regions 450 (e.g., poly), the drain region 440, and the source regions 430 as shown. In this illustration, the wells (e.g., N-well 420, deep N-well 414) and STI 460 are not shown, for simplicity.

Exemplary Vco Using Varactor Embodiments of the Invention

Figure 6:
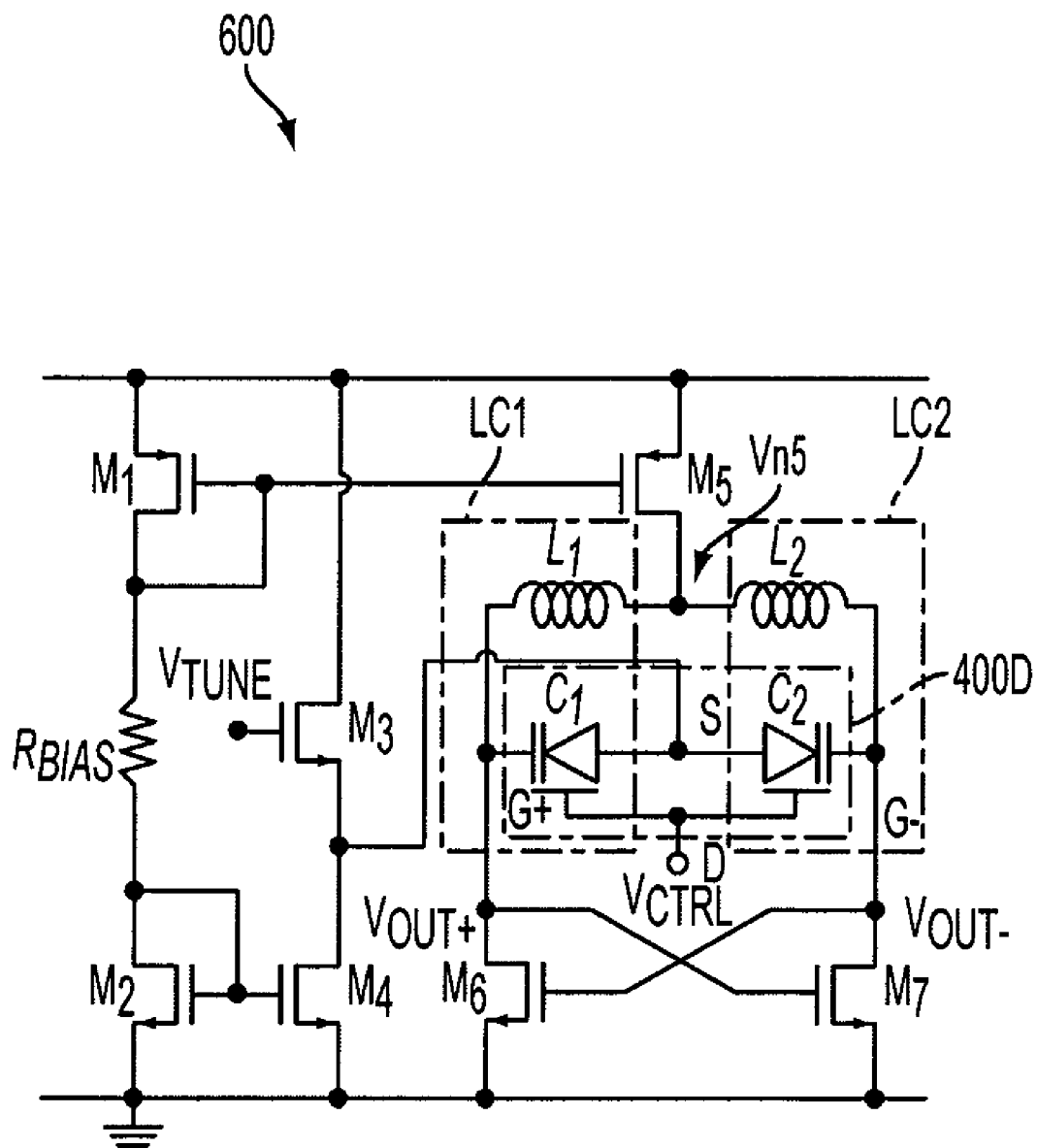
FIG. 6 shows an LC VCO circuit utilizing the differential varactor in FIG. 4D, in accordance with an embodiment.

FIG. 6 shows a Voltage-Controlled Oscillator (VCO) circuit 600 utilizing varactor 400D in accordance with an embodiment. Circuit 600 without varactor 400D may be referred to as an LC (Inductor/Capacitor) tank, an LC VCO (Voltage-Controlled Oscillator), etc., and is commonly known in the art. Adding varactor 400D to form LC VCO 600 improves the known LC VCO circuit. As shown in FIG. 6, terminal D of varactor 400D may be considered as terminal Vctrl, terminal S of varactor 400D is coupled to the pair of transistors M3 and M4, and terminal G+ and G− of varactor 400D are coupled to terminals Vout+ and Vout−, respectively. Terminals G+, G−, S, Vctrl, varactor capacitor C1 and C2, and inductors L1 and L2 form a full differential pair LC tank. Transistors M1, M2, M3, M4, M5, M6, and M7 and resistor Rbias provide suitable bias and negative Gm for VCO design operation. In an application, inputs to varactor 470L and 470R at terminals G+ and G− include RF signals and a constant DC voltage, the C-V characteristics of varactor 470L and 470R can be easily changed by changing voltage VD or Vctrl. Depending on applications, terminal S instead of being coupled between transistors M3 and M4 as shown, may be coupled differently, e.g., to ground.

The capacitance provided by the differential varactor pair 470L (e.g., varactor C1) and 470L (e.g., varactor C2) together with inductors L1 and L2 from the LC tanks for VCO 600. For example, varactor C1 and inductor L1 form a first LC tank (e.g., LC tank LC1), and varactor C2 and inductor L2 form a second LC tank (e.g., LC tank LC2). These LC tanks LC1 and LC2 provide the oscillation frequency for VCO 600.

In various embodiments of the invention, varying a DC (direct current) bias, e.g., DC voltage at terminal Vctrl, changes the frequencies of VCO 600 based on the frequency provided by the LC tanks LC1 and LC2. Changing bias voltage Vn5 also changes the frequency for VCO 600. There are various ways to change voltage Vn5, including, for example, changing the voltage at the gate of transistor M5, the current and the size of transistor M1, the value of resistor Rbias, the size of transistors M2, M3, M4, etc. Those skilled in the art will recognize that transistor M1 acting as a current mirror mirrors the current to transistor M5, and transistor M2 also acting as a current mirror mirrors the current to transistor M4 and affects the current of transistor M3. Changing the current of transistor M1 may be changed by changing the value of resistor Rbias. Changing voltage Vtune controls transistor M3, also controls voltage Vn5.

Depending on application, radio frequency signals (RF, usually in GHz range) may exist at terminal Vout+ and Vout− in some embodiments. Based on a relationship (e.g., a curve) between the Q-factor and the frequency provided by varactors 470L and 470R, the frequency of the RF signals can be measured with appropriate equipment. For example, the signal with AC and DC components may be provided at the S terminal, and the probes of the high frequency measurement equipment can be connected to terminal G+, G−, D, etc. In an embodiment, the frequency in the range of 200 MHz to 13 GHz may be detected.

The differential varactor pair 470R and 470L in conjunction with the SOI process that generally provides a buried oxide layer can minimize the effect of noise on RF circuits, especially RF noise coupled to the substrate (e.g., substrate 410). The differential pair 470R and 470L, based on the differential characteristic, can cancel the phase noise. Because of the low noise, high Q and high tuning characteristic, circuit 600 including varactor 400D may be used in SoC applications, on bulk CMOS or SOI process. Embodiments of the invention can get higher capacitance tuning, higher Q-factor, and higher voltage tuning due to the advantage of lower channel resistance, smaller capacitance parasitic, higher tuning range, and are suitable for SoC applications because embodiments require less die areas in conjunction with CMOS process.

Embodiments can improve immunity to noise coupled from other circuits. Embodiments can provide higher capacitance tuning because, depending on configurations, embodiment can utilize capacitance contributed by all junction capacitor 115, channel capacitor 125, and oxide capacitor 155. Embodiments can provide a high Q factor because the differential pair 470R and 470L and gated configuration can reduce resistance in conjunction with the SOI process. Embodiments can also enable better phase noise performance because each varactor 470L or 470R can reduce the coupling noise from substrate 110. Additionally, based on the differential configuration, the pair of varactors 470L and 470R can cancel phase noise. Because the buried oxidation in the substrate (e.g., substrate 410) can prevent AC coupling to the substrate, it can also reduce parasitic effects and noise from the same substrate. As a result, linear characteristic can be achieved from the varactor capacitors (e.g., capacitors 115, 125, and 155).

In various embodiments of the invention, the differential varactor 470 can reduce the effect of common-mode noise coupled through the substrate (e.g., substrate 410). This is because the phase difference (e.g., 180 degree difference) in terminals Vout+ and Vout− (or terminals G+ or G−) can cancel the common mode noise coupled through the substrate. In single-chip designs for RF (radio frequency) operation, embodiments also minimize the effect of noise from other circuits including, for example, digital, RF, or base-band analog circuits. In various embodiments, the phase noise originates from oxidation trap, the substrate, and/or the common mode signal noise. The differential pair 470 in various embodiments of the invention can cancel the common mode signal noise whereas the SOI process can cancel the substrate noise.

Exemplary Layout Embodiments of the
Four-Terminal Gated Varactor

Figure 7:
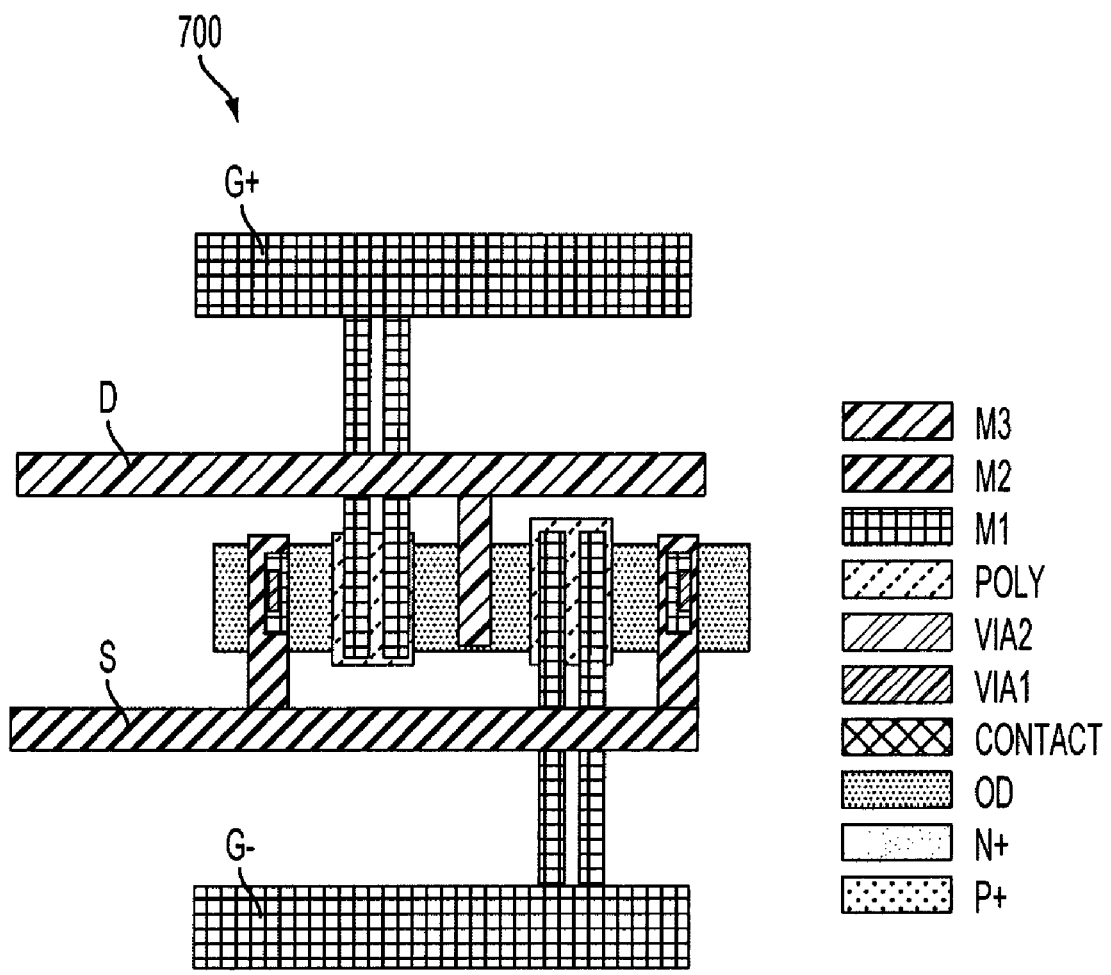
FIG. 7 shows a symmetrical layout of the differential varactor in FIG. 4A, in accordance with an embodiment.

FIG. 7 shows a layout 700 corresponding to varactor 470 or varactor 400D, in accordance with an embodiment. Terminals G+ and G− are formed with metal layer M1, source terminal S is formed with metal layer M2, and drain terminal is formed with metal layer M3. Other elements of varactor 100A may be formed in accordance with techniques and/or technologies known in the art. In various embodiments of the invention, terminal G+ and G− are formed symmetrically and thus are suitable for differential signal inputs without losing any phase difference.

Figure 8:
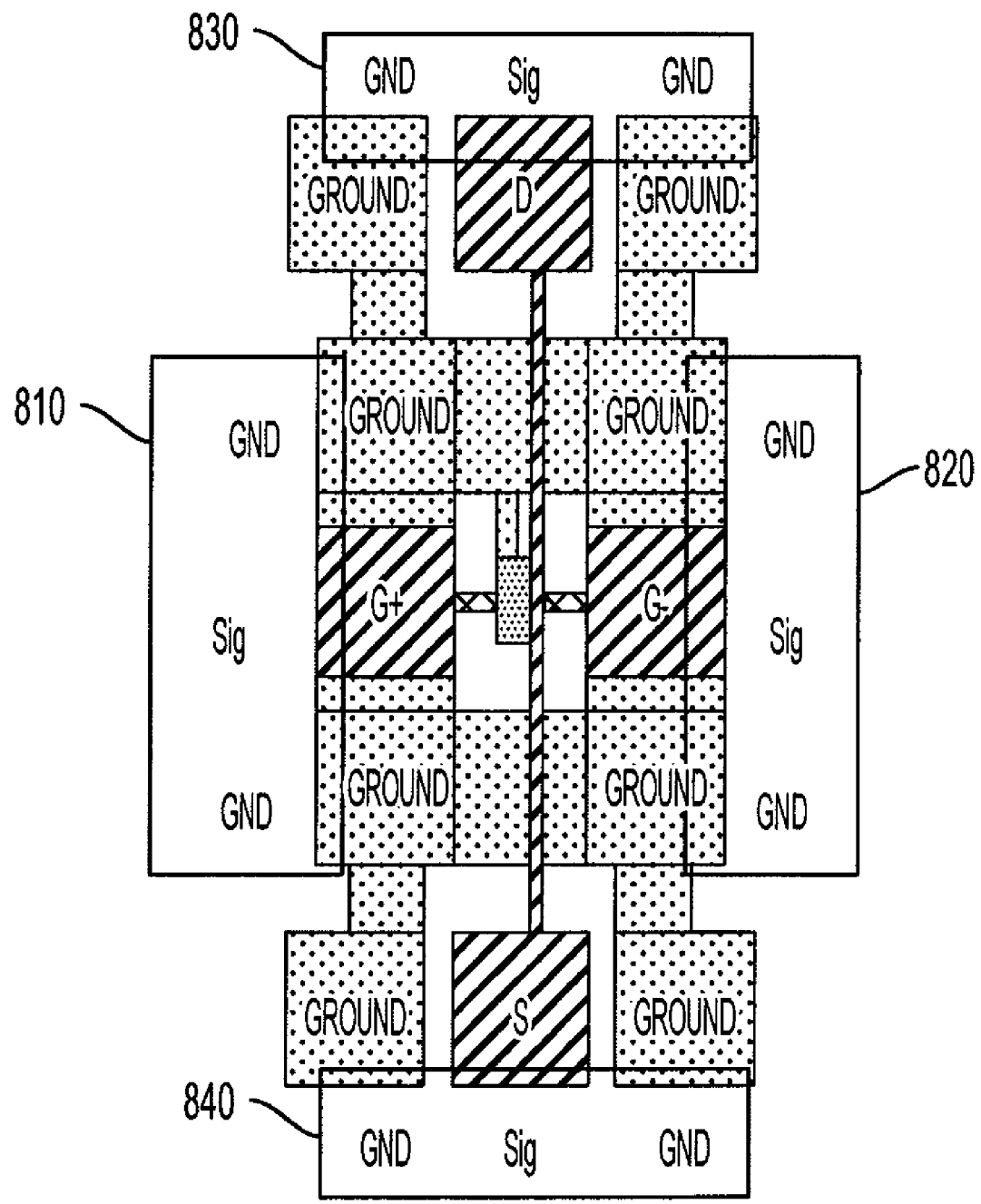
FIG. 8 shows a top view of the layout in FIG. 7 illustrating the varactor in FIG. 4A being used with an external measuring equipment to acquire the desired varactor characteristic.

FIG. 8 shows a top view of layout 700 illustrating varactor 470 being used in conjunction with an external measuring equipment, in accordance with an embodiment. In this illustration, varactor 470 together with the measuring equipment can provide the relationship between the capacitance and frequency, and Q-factor and frequency, etc. Probes 810, 820, 830, and 840 of the measuring equipment are coupled to corresponding terminals G+, G−, D, and S of varactor 470, and varactor 470 is exercised at appropriate terminals G+, G−, D, and S to provide the desired relationship.

Each probe 810, 820, 830, and 840 uses three terminals ground, signal, and ground, designated as GND, Sig, GND. In an embodiment, varactor 470 is built in such a way to adapt to the equipment probes having the pattern GND, Sig, GND. As a result, in the layout of FIG. 8, each terminal G+, G−, D, and S of varactor 470 is next to two ground pads designated "ground" to adapt to the GND, Sig, GND pattern of the measuring equipment. As shown, probes 810, 820, 830, and 840 are coupled to terminals G+, G−, D, and S and associated neighboring grounds of those terminals.

FIG. 9 is a flowchart 900 illustrating a method related to a varactor (e.g., varactor 100A) in accordance with some embodiments.

In step 910, N-well 120 is formed over substrate 110.

In step 915, drain region 140 and source region 130 are formed over N-well 120.

In step 920, channel capacitor 125, oxide capacitor 155, and junction capacitor 115 are formed.

In step 925, the relationship between gate voltage VG, drain voltage VD, and total capacitance contributed by the junction capacitor, the channel capacitor, and the oxide capacitor are acquired.

A number of embodiments have been described. It will nevertheless be understood that various modifications may be made without departing from the spirit and scope of the invention. For example, the differential pair 470 is shown embedded in VCO 600, but embodiments of the invention are not so limited. A single ended varactor (e.g., MOSVAR 100A, JVAR 100B, varactor 470L or 470R), and/or a differential pair 470, may be used in various other applications that can benefit therefrom, including, for example, high Q factor, wider tuning ranges, etc. The method example in FIG. 9 was described with exemplary steps, which are not necessarily performed in the order as explained. Steps may be added, replaced, changed in order, and/or eliminated as appropriate, in accordance with the spirit and scope of the disclosed embodiments.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalences to which such claims are entitled.

What is claimed is:

1. A method of operating a semiconductor device that has a well over a substrate, and a gate region, a source region, and a drain region over the well, the method comprising:

forming a channel capacitor between a source region having a source voltage and a drain region having a drain voltage;

forming an oxide capacitor in the gate region having a gate voltage and a junction capacitor between the well and the source region or between the well and the drain region; and adjusting one or a combination of the drain voltage and the gate voltage to acquire a relationship between the drain voltage, the gate voltage, and total capacitance contributed by the junction capacitor, the channel capacitor, and the oxide capacitor.

2. The method of claim 1 wherein
the source region is of a heavy first dopant type;
the drain region is of heavy second dopant type; the second dopant type being different from the first dopant type;
the junction capacitor is formed between the source region and the well or between the drain region and the well.

3. The method of claim 1 further allowing the gate voltage to be the same as a source voltage, thereby allowing the junction capacitance to be dominant in contributing capacitance to the total capacitance.

4. The method of claim 1 wherein the channel capacitor comprises a reverse oxide channel capacitor and a junction depletion capacitor formed by a P+ and N junction.

5. The method of claim 1 wherein the channel capacitor is in series with the oxide capacitor and/or merged with the junction capacitor.

6. The method of claim 5 wherein the channel capacitor is merged with the junction capacitor when the gate voltage is equal to a source voltage.

7. The method of claim 1 wherein a waveform representing a relationship between the gate voltage and the total capacitance at a value of the drain voltage includes a portion representing capacitance of the junction capacitor and a portion representing capacitance of the oxide capacitance.

8. The method of claim 1 wherein a waveform representing a relationship between the gate voltage and the total capacitance at a value of the drain voltage includes a slope that varies based on a change of the value of the drain voltage.

9. The method of claim 1 further providing a buried oxide layer between the well and the substrate.

10. A differential varactor structure comprising:
a drain region comprising a first dopant type; a drain terminal coupled to the drain region;
a first source region comprising a second dopant type;
a second source region comprising the second dopant type;
a source terminal coupled to the first source region and the second source region;
a first gate formed in association with the drain region and the first source region; a first gate terminal coupled to the first gate; and
a second gate formed in association with the drain region and the second source region; a second gate terminal coupled to the second gate.

11. The differential varactor structure of claim 10 further providing a C-V relationship based on voltage changes at one or a combination of the drain terminal, the source terminal, the first gate terminal, and the second gate terminal.

12. The differential varactor structure of claim 10 being manufactured from a CMOS process or a SOI CMOS process.

13. The differential varactor structure of claim 10, wherein the first gate region, the drain region, and one of the first source region and the second source region are arranged to form a first varactor, and the second gate region, the drain region, and the other one of the first source region and the second source region are arranged to form a second varactor.

14. A differential varactor structure comprising:
a pair of source regions;
a pair of gate regions;
a drain region between the pair of source regions and between the pair of gate regions;
a pair of junction capacitors formed by reverse biasing a well and the pair of source regions;
a pair of channel capacitors between the drain region and the pair of source regions;
a pair of oxide capacitors in the pair of gate regions;
a drain terminal coupled to the drain region;
a source terminal coupled to the pair of source regions;
a first gate terminal coupled to a first gate region of the pair of the gate regions and a second gate terminal coupled to a second gate region of the pair of the gate regions.

15. The differential varactor structure of claim 14 wherein the well comprises a first dopant type, and the differential varactor structure further comprising
a heavy doped first dopant type in the drain region;
a heave doped second dopant type in the pair of source regions.

16. The differential varactor structure of claim 15 further comprising a deep well between the well and a substrate.

17. The differential varactor structure of claim 15 further comprising a buried oxide layer between the well and the substrate.

18. The differential varactor structure of claim 14 wherein the first gate terminal and the second gate terminal are coupled to a pair of outputs of a voltage controlled oscillator.

19. The differential varactor structure of claim 14 wherein layouts of the first gate terminal and the second gate terminal are symmetrical.

20. The differential varactor structure of claim 14 wherein each of the drain terminal, the source terminal, the first gate terminal, and the second gate terminal is adjacent to a pair of grounds.

* * * * *